US008409355B2

(12) United States Patent
Rasheed et al.

(10) Patent No.: US 8,409,355 B2

(45) Date of Patent: Apr. 2, 2013

(54) LOW PROFILE PROCESS KIT

(75) Inventors: Muhammad M. Rasheed, Fremont, CA (US); Teruki Iwashita, Chiba (JP); Hiroshi Otake, Chiba (JP); Yuki Koga, Mie (JP); Kazutoshi Maehara, Chiba-ken (JP); Xinglong Chen, San Jose, CA (US); Sudhir Gondhalekar, Fremont, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1030 days.

(21) Appl. No.: 12/109,187

(22) Filed: Apr. 24, 2008

(65) Prior Publication Data

US 2009/0266299 A1 Oct. 29, 2009

(51) Int. Cl.
*C23C 16/00* (2006.01)
*C23F 1/00* (2006.01)
*H01L 21/306* (2006.01)

(52) U.S. Cl. ........ 118/728; 118/725; 118/729; 118/730; 156/345.51; 156/345.52; 156/345.53; 156/345.54; 156/345.55; 156/915

(58) Field of Classification Search .................. 118/725, 118/728–730; 156/345.51–345.55, 915
See application file for complete search history.

(56) References Cited

U.S. PATENT DOCUMENTS 5,094,885 A * 3/1992 Selbrede .................... 427/248.1
5,326,725 A * 7/1994 Sherstinsky et al. .......... 438/778
5,942,039 A * 8/1999 Kholodenko et al. .... 118/723 E
6,077,353 A * 6/2000 Al-Sharif et al. ............. 118/500
6,186,092 B1 * 2/2001 Tsai et al. ..................... 118/728
6,344,105 B1 * 2/2002 Daugherty et al. ...... 156/345.51
6,589,352 B1 7/2003 Yudovsky et al.
6,602,793 B1 * 8/2003 Masterson .................... 438/706
2004/0003780 A1 1/2004 Yudovsky et al.
2005/0016684 A1 1/2005 Sun et al.
2007/0032081 A1 * 2/2007 Chang et al. .................. 438/689
2007/0102286 A1 5/2007 Scheible et al.
2007/0173059 A1 7/2007 Young et al.
2007/0283884 A1 12/2007 Tiller et al.

FOREIGN PATENT DOCUMENTS

WO WO99-65057 A1 12/1999

OTHER PUBLICATIONS

International Search Report and Written Opinion mailed Dec. 23, 2009 for PCT Application No. PCT/US2009/041528.

* cited by examiner

*Primary Examiner* — Rakesh Dhingra
(74) *Attorney, Agent, or Firm* — Moser Taboada; Alan Taboada

(57) ABSTRACT

Embodiments of process kits for substrate supports of semiconductor substrate process chambers are provided herein. In some embodiments, a process kit for a semiconductor process chamber may include an annular body being substantially horizontal and having an inner and an outer edge, and an upper and a lower surface; an inner lip disposed proximate the inner edge and extending vertically from the upper surface; and an outer lip disposed proximate the outer edge and on the lower surface, and having a shape conforming to a surface of the substrate support pedestal. In some embodiments, a process kit for a semiconductor process chamber my include an annular body having an inner and an outer edge, and having an upper and lower surface, the upper surface disposed at a downward angle of between about 5-65 degrees in an radially outward direction from the inner edge toward the outer edge.

23 Claims, 3 Drawing Sheets

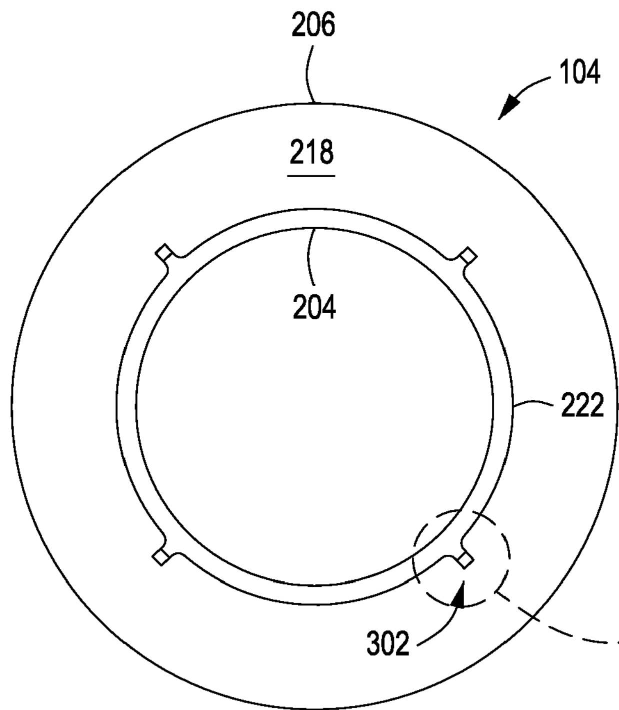
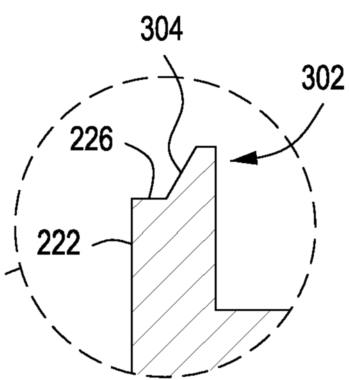
FIG. 3
FIG. 3A
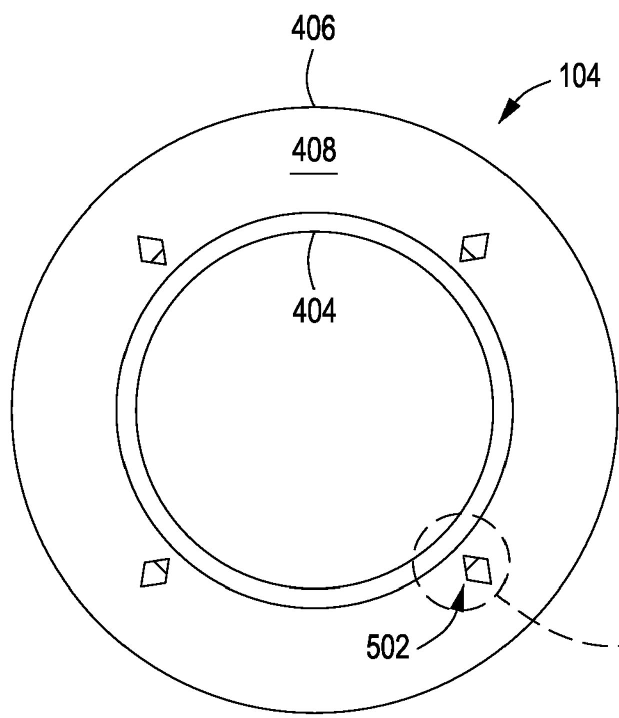
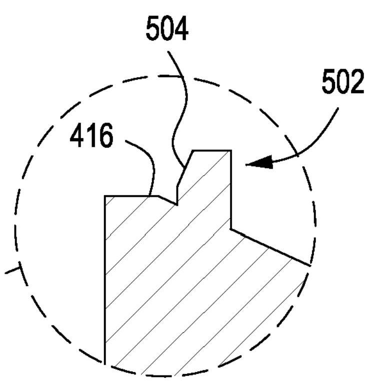
FIG. 5
FIG. 5A

LOW PROFILE PROCESS KIT

BACKGROUND OF THE INVENTION

1. Field of the Invention

Embodiments of the present invention generally relate to equipment for performing semiconductor device fabrication, and more particularly, to a process kit for partially covering a surface of a substrate support.

2. Description of the Related Art

Substrate supports are used for supporting a semiconductor substrate (or semiconductor wafer or wafer as referred to herein) within semiconductor processing equipment such as a plasma processing chamber. A substrate support generally holds a substrate in a stationary position during processing of the substrate, e.g., during material deposition or etching, by use of an electrostatic chuck or the like.

During plasma processes, such as plasma assisted chemical vapor deposition (CVD) processes, components of the substrate support may become covered with deposited materials from the process. Such materials may include oxide or fluoride powders, and may damage the substrate support or may flake off or be removed from the substrate support and contaminate the substrate being processed. Moreover, exposed metal surfaces of the substrate support may lead to arcing in the plasma process and metal contamination of the substrate and/or the chamber. To mitigate these problems, a process kit may be disposed atop and/or around the substrate support to prevent such damage and/or contamination. However, contaminants deposited on the process kit proximate the wafer edge may still contaminate the wafer being processed. Moreover, in certain processes, materials sputtered off of the substrate proximate the substrate edge may be deposited upon the process kit near the substrate edge, thereby increasing the buildup of materials on the process kit and shortening the mean time between cleaning.

Accordingly, there is a need for an improved process kit.

SUMMARY

Embodiments of process kits for substrate supports of semiconductor substrate process chambers are provided herein. In some embodiments, a process kit for a semiconductor process chamber may include an annular body being substantially horizontal and having an inner and an outer edge, and an upper and a lower surface; an inner lip disposed proximate the inner edge and extending vertically from the upper surface at least about 0.1 inches; and an outer lip disposed proximate the outer edge and on the lower surface, and having a shape conforming to a surface of the substrate support pedestal.

In some embodiments, an apparatus for processing a substrate may include a semiconductor process chamber having a substrate support pedestal disposed therein; and a process kit disposed on a surface of the substrate support pedestal, the process kit including: an annular body being substantially horizontal and having an inner and outer edge, and an upper and lower surface; an inner lip disposed proximate the inner edge and extending vertically from the upper surface by at least about 0.1 inches; and an outer lip dispose proximate the outer edge and on the lower surface, and having a shape conforming to a surface of substrate support pedestal having the outer lip disposed thereon.

In some embodiments, a process kit for a semiconductor process chamber my include an annular body having an inner and an outer edge, and having an upper and lower surface, the upper surface disposed at a downward angle of between about 5-65 degrees in an radially outward direction from the inner edge toward the outer edge. An inner lip may be disposed proximate the inner edge and having a horizontal surface extending from the upper surface of the annular body. An outer lip dispose proximate the outer edge and on the lower surface, and having a shape conforming to a surface of substrate support pedestal having the outer lip disposed thereon.

In some embodiments, an apparatus for processing a substrate may include a semiconductor process chamber having a substrate support pedestal disposed therein; and a process kit disposed on a surface of the substrate support pedestal, the process kit including an annular body having an inner and an outer edge, and having an upper and lower surface, the upper surface disposed at a downward angle of between about 5-65 degrees in an radially outward direction from the inner edge toward the outer edge. An inner lip may be disposed proximate the inner edge and having a horizontal surface extending from the upper surface of the annular body. An outer lip dispose proximate the outer edge and on the lower surface, and having a shape conforming to a surface of substrate support pedestal having the outer lip disposed thereon.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 depicts a top view of the process kit of FIG. 2.

FIG. 3A depicts a partial cross sectional view of the process kit of FIG. 3.

FIG. 5 depicts a top view of the process kit of FIG. 4.

FIG. 5A depicts a partial cross sectional view of the process kit of FIG. 5.

Figure 1:
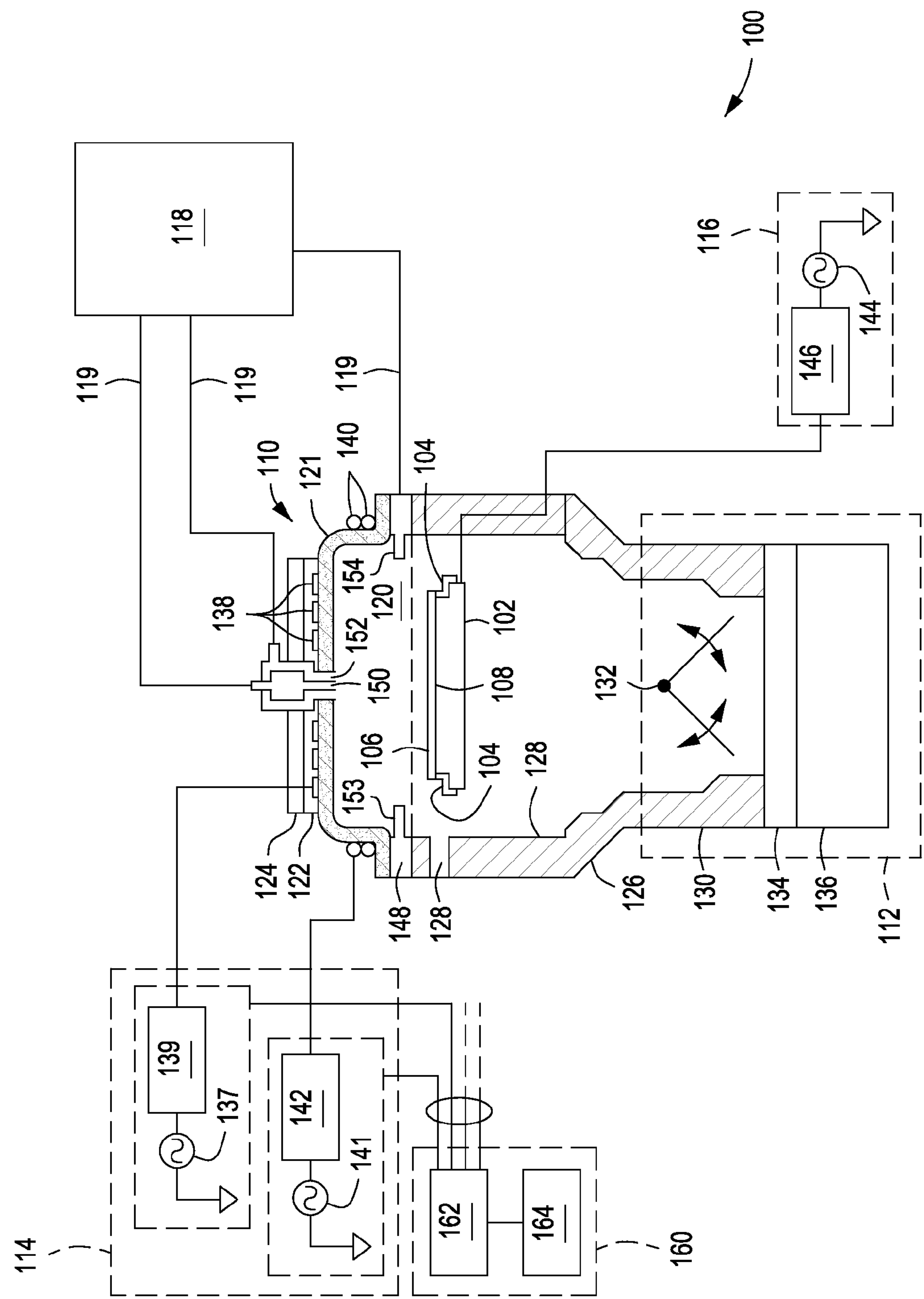
FIG. 1 depicts a schematic diagram of one embodiment of an illustrative chamber used to perform the method of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The present invention provides embodiments of a process kit for surrounding a substrate disposed on a substrate support and for covering the surface of the substrate support disposed radially outwards of the substrate. The process kit may have an annular body having either a substantially horizontal or tapered profile. The profile of the process kit may advantageously facilitate reduced contamination of the substrate surface during substrate processing, and reduced cleaning time during chamber cleaning processes.

FIG. 1 illustrates a plasma-based substrate processing system 100 including a process kit 104 in accordance with various embodiments of the present invention. The plasma-based substrate processing system 100 can be used for temperature controlled processing of substrates, such as Silicon wafers, GaAs wafers and the like, while creating and maintaining a plasma environment in which to process the substrates. The plasma is created in the vicinity of the substrate for processing the substrate, and the temperature of the substrate is controlled using various techniques, such as, by supplying a heat transfer fluid to the back surface of the substrate. Although one embodiment of a plasma processing chamber is described illustratively in a high density plasma-chemical vapor deposition (HDP-CVD) system such as the 300 mm HDP-CVD Ultima X system available from Applied Materials, Inc. of Santa Clara, Calif., the invention has utility in other process chambers where plasma is used including physical vapor deposition chambers, chemical vapor deposition chambers, etch chambers and other applications where a process kit may prevent or limit contaminants resulting from processing the substrate from depositing on a surface of the substrate support and proximate the substrate being processed.

The plasma-based substrate processing system 100 includes a process chamber 110, a vacuum system 112, a source plasma system 114, a bias plasma system 116, a gas delivery system 118, and a remote plasma cleaning system (not shown).

A substrate support 102 may disposed within the process chamber 100 for supporting a substrate 106 thereupon during processing, The substrate support may include various components, such as an electrostatic chuck 108 to clamp the substrate 106 to the substrate support 102, or other components as described in more detail below. The process kit 104 may generally be configured to cover at least a portion of the substrate support 102 that is not covered by the substrate 106 when the substrate 106 is disposed thereon. The process kit 104 may be configured to advantageously provide reduced contamination of the substrate surface during processing, and reduced cleaning time during chamber cleaning processes, as compared to conventional process kits.

Figure 2:
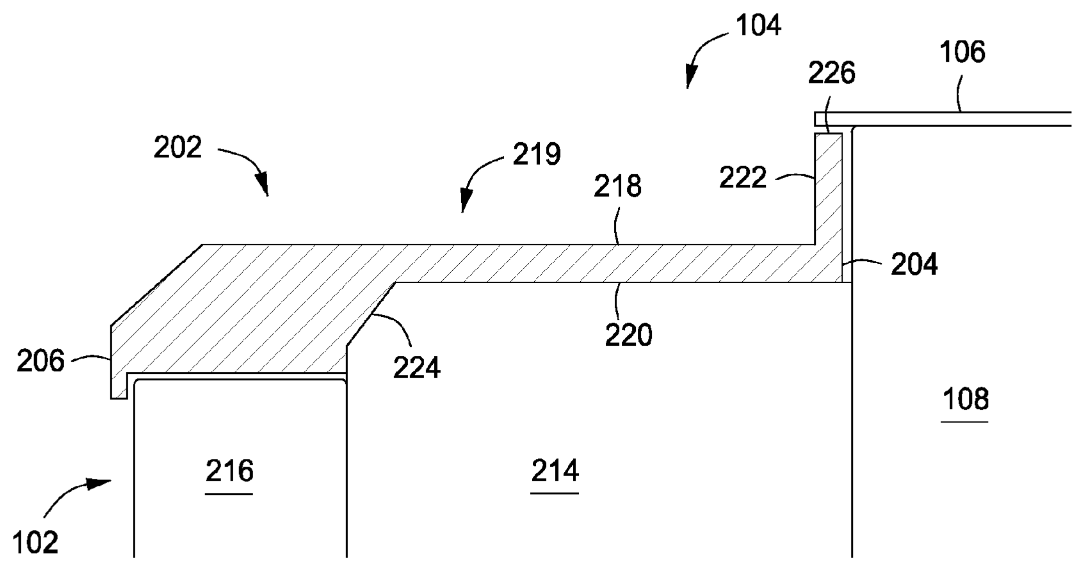
FIG. 2 depicts embodiments of a process kit in accordance with the present invention.

The process kit 104 may have various embodiments in accordance with the present invention and are described below with respect to FIGS. 2-3. For example, FIG. 2 depicts one embodiment of the process kit 104 in accordance with some embodiments of the present invention. For illustration, the process kit 104 is described as utilized with one exemplary configuration of the substrate support 106. In some embodiments, the substrate support 106 may include the electrostatic chuck 108, an insulating collar 214, and a grounded electrically conductive bucket 216. The insulating collar 214 may comprise a dielectric material and may be disposed about the electrostatic chuck 108. The bucket 216 may comprise aluminum (Al) and may be disposed about the insulating collar 214. Such a configuration of the substrate support 102 may advantageously prevent arcing between the substrate support 102 and the walls of the process chamber (as shown, for example, in FIG. 1), or between the substrate 106 and the walls of the process chamber. Although the process kit 104 is described herein with respect to one configuration of the substrate support 102, it is contemplated that process kits in accordance with the teachings provided herein may be modified to be utilized with substrate supports having other dimensions as well without departing from the scope of the present invention.

The process kit 104 may be fabricated from multiple or one-piece construction and may be formed from ceramic materials. In some embodiments the process kit 104 may be fabricated from ceramics such as aluminum oxide (99.5% purity $Al_2O_3$), high purity aluminum oxide (99.99% purity $Al_2O_3$), aluminum nitride (AlN), other ceramics, or the like. The process kit 104 may include an annular body 202 having an outer edge 206 and an inner edge 204. The outer edge 206 of the annular body 202 may be located proximate an outer edge of the substrate support 102 such that the process kit 104 may substantially or completely cover the upper surface of the substrate support 102 when placed thereupon.

The inner edge 204 of the annular body 202 may define an opening sized to correspond to the diameter of the electrostatic chuck 108 such that the electrostatic chuck 108 may extend therethrough when the process kit 104 is disposed on the substrate support 102. In some embodiments, a diameter of the opening, as measured from a center (not shown) of the annular body 202 to the inner edge 204 of the annular body 202, is between about 11.00-13.00 inches. In some embodiments, the diameter is about 11.736 inches.

The annular body 202 further includes an upper surface 218 and a lower surface 220. In some embodiments, the upper surface 218 may be substantially planar, or may have a substantially planar main portion 219. In some embodiments, the lower surface 220 may have a profile configured to substantially contact an upper surface of the insulating collar 214. In some embodiments, the lower surface 220 may have a profile configured to substantially cover the upper surface of the insulating collar 214 and an upper surface of the bucket 216. The thickness of the annular body 202—defined as the perpendicular distance between the upper surface 218 and the lower surface 220—may be as small as possible without reducing the mechanical integrity of the process kit 104, thereby facilitating rapid increase of the temperature of the process kit 104 during cleaning processes, which facilitates efficient and rapid removal of contaminants from the surface of the process kit 104. In some embodiments, the thickness of the annular body 202 may be about 0.079 inches.

An inner lip 222 may be disposed on the upper surface 218 of the annular body 202, proximate the inner edge 204 thereof. The inner lip 222 may extend upwards from the annular body 202 and may be generally parallel to the outer diameter of the electrostatic chuck 108. The inner lip 222 may extend upwards to a point proximate, but not touching, a bottom surface of the substrate 106 mounted on the electrostatic chuck 108. In some embodiments, a distance measured vertically from the upper surface 226 of the inner lip 222 to the bottom surface of the substrate 106 is between about 0.01-0.003 inches, or in some embodiments, about 0.006 inches. In some embodiments, a distance measured vertically from the upper surface 218 of the annular body 202 to an upper surface 226 of the inner lip 222 is at least about 0.1 inches, or in some embodiments, about 0.127 inches. In some embodiments, a distance measured vertically from the upper surface 218 of the annular body 202 to an upper surface 226 of the inner lip 222 is between about 0.1 inches and about 0.5 inches. In some embodiments, a distance measured vertically from the lower surface 220 of the annular body to the upper surface 226 of the inner lip 222 is about 0.206 inches.

The inner lip 222 may be disposed completely beneath, or substantially beneath, the substrate 106, thereby limiting the surface area of the inner lip 222 that is exposed to the processing conditions adjacent to the substrate 106 (and thereby reducing any buildup of contaminants on the upper surface 226 of the inner lip 222). The inner lip 222 may generally have any thickness, so long the outer diameter of the inner lip 222 is not substantially greater than the diameter of the substrate 106. In some embodiments, the thickness of the inner lip 222 is about 0.216 inches.

An outer lip 224 may extend downward from the lower surface 220 of the annular body 202 proximate the outer edge 206 thereof. The outer lip 224 may have any desired shape that conforms to a shape of the substrate support 102 therebelow. In some embodiments, and as illustrated in FIG. 2, the outer lip 224 is disposed above the bucket 216 and a portion of the insulating collar 214. In some embodiments, the outer lip 224 may contact all or some portions of the substrate support 102 on which the outer lip 224 is disposed. As illustrated in FIG. 2, the outer lip 224 contacts a portion of the insulating collar 214 and does not contact the bucket 216. In some embodiments, the process kit 104 does not contact the bucket 216 to minimize any cooling of the process kit 104 by thermal transfer to the bucket 216. In some embodiments, the outer lip 224 may overhang the outer edge of the substrate support 102 to provide addition protection from contamination or damage to the substrate support 102.

In some embodiments, and as shown in the top view of the process kit in FIG. 3, a plurality of guide pins 302 may be provide about the upper surface 218 of the process kit 104 to facilitate centering the substrate 106 atop the substrate support 102. In some embodiments, and as shown in FIG. 3, four guide pins 302 may be provided, although greater or fewer guide pins 302 may be provided (e.g., at least three). In some embodiments, the guide pins 302 may be substantially equidistantly spaced about the process kit 104.

In some embodiments, and as shown in more detail in FIG. 3A, the guide pins 302 may further include a feature 304, such as an angled face, to further facilitate urging a substrate 106 towards the center of the process kit 104 (and, therefore, the substrate support 102). In some embodiments, the guide pins 302 may be connected to the inner lip 222 to provide additional physical support to the guide pins 302 and to prevent damage thereto.

Figure 4:
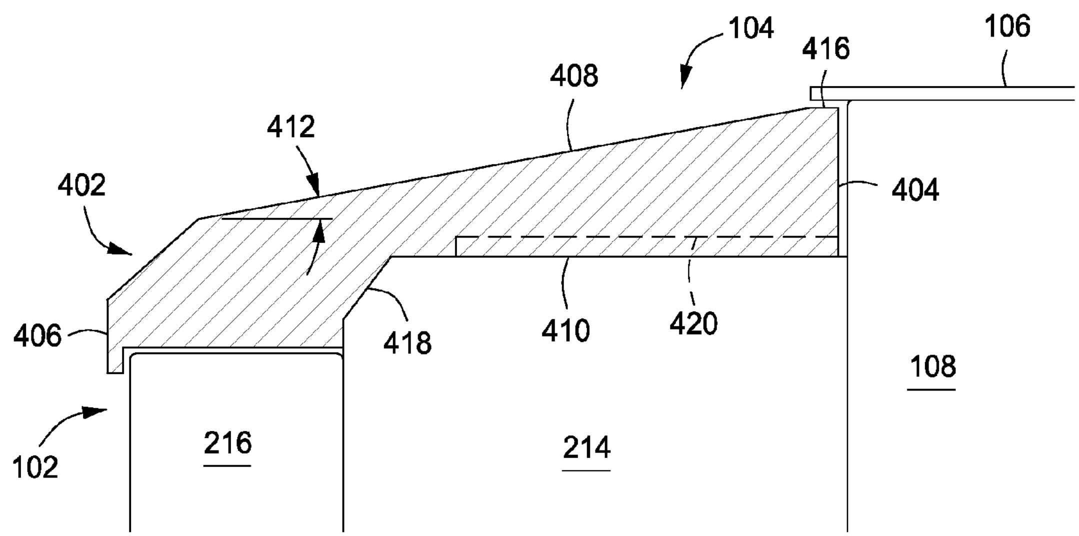
FIG. 4 depicts embodiments of a process kit in accordance with the present invention.

FIG. 4 depicts some variations of the process kit 104 in accordance with some embodiments of the present invention. The process kit 104 may be fabricated from the same materials as discussed above and may be fabricated in one or more pieces. The process kit 104 may include an annular body 402 having an outer edge 406 and an inner edge 404. The outer edge 406 of the annular body 402 may be located proximate an outer edge of the substrate support 102 such that the process kit 104 may substantially or completely cover the upper surface of the substrate support 102 when placed thereupon.

The inner edge 404 of the annular body 402 may define an opening sized to correspond to the diameter of the electrostatic chuck 108 such that the electrostatic chuck 108 may extend therethrough when the process kit 104 is disposed on the substrate support 102. In some embodiments, a diameter of the opening, as measured from a center (not shown) of the annular body 402 to the inner edge 404 of the annular body 402, is between about 11.00-13.00 inches. In some embodiments, the diameter is about 11.736 inches.

The annular body 402 further includes an upper surface 408 and a lower surface 410. In some embodiments, the upper surface 408 may be angled downward between the inner edge 404 and the outer edge 406 such that the thickness of the process kit 104 tapers from a thicker portion proximate the inner edge 404 to a thinner portion towards the outer edge 406. In some embodiments, an angle 412 of the upper surface 408, defined between horizontal and the upper surface 408, may be between about 5-65 degrees. In some embodiments, the angle 412 is about 7.5 degrees. It is contemplated that other profiles besides a linear angled, or tapered, profile may also be utilized. For example, a combination of the embodiments disclosed herein may be utilized (e.g., the upper surface may be angled proximate the inner edge of the annular body and may extend horizontally outwards from the end of the angled portion towards the outer edge of the annular body 202).

The angled upper surface 408 advantageously provides improved gas flow proximate the upper surface 408. The improved gas flow along the top surface facilitates pushing particles down the slope, and reduced residual time of contaminants, thereby reducing deposition on the process kit. Moreover, the angled process kit facilitates a flow-assisted removal of contaminants deposited on the process kit during cleaning processes by similarly increasing the process flow over the upper surface 408 of the process kit 104 and by eliminating reduced flow spaces that may exist in corners of other designs, thereby reducing the downtime required for process kit cleaning.

In some embodiments, the lower surface 410 may have a profile configured to substantially contact an upper surface of the insulating collar 214. In some embodiments, the lower surface 410 may have a profile configured to substantially cover the upper surface of the insulating collar 214 and an upper surface of the bucket 216. In some embodiments, and as shown in phantom at 420, at least a portion of the lower surface 410 may be spaced apart from the upper surface of the insulating collar 214 (or more generally from the substrate support 106). In some embodiments, at least a portion of the lower surface 410 may be spaced apart from the substrate support by up to about 0.030 inches.

The thickness of the annular body 402—defined as the perpendicular distance between the upper surface 408 and the lower surface 410—may taper downward in a radially outward direction. In some embodiments, the thickness of the annular body 402 may range from about 0.206 inches proximate the inner edge 404 to a lesser thickness that is great enough to maintain the mechanical integrity of the process kit (e.g., thick enough to prevent breaking or damage to the process kit).

In some embodiments, the upper surface 408 of the annular body 402 may include an inner lip 416 proximate the inner edge 404 thereof. The inner lip 416 may extend generally parallel to the upper surface of the electrostatic chuck 108. The inner lip 416 may be disposed proximate, but not touching, a bottom surface of the substrate 106 mounted on the electrostatic chuck 108. In some embodiments, a distance measured vertically from the inner lip 416 to the bottom surface of the substrate 106 is between about 0.01-0.003 inches, or in some embodiments, about 0.006 inches. In some embodiments, a distance, measured vertically from the lower surface 410 of the annular body 402 to the upper surface 408 proximate the inner lip 416 is about 0.206 inches.

The inner lip 416 may be disposed completely beneath, or substantially beneath, the substrate 106, thereby limiting the surface area of the inner lip 416 that is exposed to the processing conditions adjacent to the substrate 106 (and thereby reducing any buildup of contaminants on the upper surface 408 of the process kit 104). The inner lip 416 may generally have any width, so long the inner lip 416 does not substantially extend beyond the diameter of the substrate 106. In some embodiments, the width of the inner lip 416 is about 0.032 inches.

An outer lip 418 may extend downward from the lower surface 408 of the annular body 402 proximate the outer edge 406 thereof. The outer lip 418 may have any desired shape that conforms to a shape of the substrate support 102 therebelow. In some embodiments, and as illustrated in FIG. 4, the outer lip 418 is disposed above the bucket 216 and a portion of the insulating collar 214. In some embodiments, the outer lip 418 may contact all or some portions of the substrate support 102 on which the outer lip 418 is disposed. As illustrated in FIG. 4, the outer lip 418 contacts a portion of the insulating collar 214 and does not contact the bucket 216. In some embodiments, the process kit 104 does not contact the bucket 216 to minimize cooling of the process kit 104 by thermal transfer to the bucket 216. In some embodiments, the outer lip 418 may overhang the outer edge of the substrate support 102 to provide addition protection from contamination or damage to the substrate support 102.

In some embodiments, and as shown in the top view of the process kit in FIG. 5, a plurality of guide pins 502 may be provide about the upper surface 408 of the process kit 104 proximate the inner lip 416 to facilitate centering the substrate 106 atop the substrate support 102. In some embodiments, and as shown in FIG. 5, four guide pins 502 may be provided, although greater or fewer guide pins 502 may be provided (e.g., at least three). In some embodiments, the guide pins 502 may be substantially equidistantly spaced about the process kit 104. The guide pins 502 may have a diamond shape or other profile that facilitates reduction or elimination of reduced or dead flow spaces proximate the guide pins, thereby further reducing the likelihood and amount of deposition of contaminants over time and further facilitating the removal of any contaminants deposited proximate the guide pins 502.

In some embodiments, and as shown in more detail in FIG. 5A, the guide pins 502 may further include a feature 504, such as an angled face, to further facilitate urging a substrate 106 towards the center of the process kit 104 (and, therefore, the substrate support 102).

Returning to FIG. 1, an upper portion of process chamber 110 includes a dome 121, which may be made of a dielectric material, such as alumina or aluminum nitride. The dome 121 defines an upper boundary of a plasma processing region 120. The plasma processing region 120 is bounded on the bottom by the substrate 106 and the substrate support 102.

A heater plate 122 and a cold plate 124 surmount, and are thermally coupled to, the dome 121. The heater plate 122 and the cold plate 124 allow control of the dome temperature to within about +/−10 degrees Centigrade over a range of about 100 to 200 degrees Centigrade. This allows optimizing the dome temperature for the various processes. For example, it may be desirable to maintain the dome at a higher temperature for cleaning or etching processes than for deposition processes. Accurate control of the dome temperature also reduces the flake or particle counts in the process chamber and improves adhesion between the deposited layer and the substrate.

The lower portion of process chamber 110 includes a body member 126, which joins the process chamber to the vacuum system. The substrate support 102 may be mounted in the body member 126. An electrostatic chuck 108 or other mechanism may be provided within or upon the substrate support 102 to secure the substrate 106 securely to the substrate support 102. Substrates may be transferred into and out of process chamber 110 by a robot blade (not shown) through an insertion/removal opening 128 in the side of process chamber 110. A pneumatic actuator (not shown) raises and lowers a lift-pin plate (not shown) that raises and lowers lift pins (not shown) that raise and lower the substrate. Upon transfer into process chamber 110, substrates are disposed on the raised lift pins, and then lowered onto the surface of the substrate support 102.

The vacuum system 112 includes a throttle body 130, which houses multi-blade throttle valve 132 and is attached to gate valve 134 and turbomolecular pump 136. The throttle body 130 may offer minimum obstruction to gas flow, and allow symmetric pumping. The gate valve 134 can isolate the pump 136 from the throttle body 130, and can also control process chamber pressure by restricting the exhaust flow capacity when throttle valve 132 is fully open. The arrangement of the throttle valve 132, gate valve 134, and turbo molecular pump 136 allow accurate and stable control of process chamber pressures from about 1 to 100 millitorr.

The source plasma system 114 includes a top coil 138 and side coil 140, mounted on dome 118. A symmetrical ground shield (not shown) reduces electrical coupling between the coils. Top coil 138 is powered by top RF source generator 137, while the side coil 140 is powered by side RF source generator 141, allowing independent power levels and frequencies of operation for each coil. This dual coil system allows control of the radial ion density in process chamber 110, thereby improving plasma uniformity. Side coil 140 and top coil 138 couple energy into the chamber 110 inductively. The top RF source generator 137 may provide up to 8000 W of RF power at nominally 2 MHz and the side RF source generator 141 may provide up to 8000 W of RF power at nominally 2 MHz. The operating frequencies of the top and side RF generators may be offset from the nominal operating frequency (e.g., to 1.7-1.9 MHz and 1.9-2.1 MHz, respectively) to improve plasma-generation efficiency.

The RF generators 137 and 141 include digitally controlled synthesizers and operate over a frequency range from about 1.7 to about 2.1 MHz. Each generator includes an RF control circuit (not shown) that measures reflected power from the process chamber and coil back to the generator, and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 139 and 142 match the output impedance of generators 137 and 141 with coils 138 and 140, respectively. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

The bias plasma system 116 includes a RF bias generator 144 and a bias matching network 146. The bias plasma system 116 may capacitively couple the electrostatic chuck 108 to the body member 126, which can act as complementary electrodes. The bias plasma system 116 serves to enhance the transport of plasma species created by the source plasma system 114 to the surface of the substrate. The RF bias generator 114 may provide up to 10000 W of RF power at 13.56 MHz.

Other measures may also help stabilize a plasma. For example, the RF control circuit can be used to determine the power delivered to the load (plasma) and may increase or decrease the generator output power to keep the delivered power substantially constant during deposition of a layer.

The gas delivery system 118 may include a plurality of gas sources (not shown). The gas sources may comprise silane, molecular oxygen, helium, argon, and the like. The gas delivery system 118 provides gases from several sources to the process chamber for processing the substrate via gas delivery lines 119 (only some of which are shown). Gases are introduced into the process chamber 110 through a gas ring 148, a top nozzle 150, and a top vent 152. Gas sources may be provided to the gas ring 128, top nozzle 150, and top vent 152 via flow controllers (not shown) and gas delivery line 119. Each gas delivery line 119 may have a flow controller to control the flow rate of a process gas. (not shown) The top nozzle 150 and top vent 152 allow independent control of top and side flows of the gases, which improves film uniformity and allows fine adjustment of the film's deposition and doping parameters. The top vent 152 is an annular opening around the top nozzle 150 through which gas may flow into the process chamber from the gas delivery system.

Gas is provided from one or more gas sources of the gas delivery system 118 to gas ring 148 via flow controllers and gas delivery lines 119. Gas ring 148 has a plurality of gas nozzles 153 and 154 (only two of which is shown) that provide a uniform flow of gas over the substrate. Nozzle length and nozzle angle may be changed by changing gas ring 148. This allows tailoring the uniformity profile and gas utilization efficiency for a particular process within an individual process chamber. Typically, gas nozzles 154 (only one of which is shown), are coplanar with, and shorter than, the second gas nozzles 153.

In some embodiments, flammable, toxic, or corrosive gases may be used. In these instances, it may be desirable to eliminate gas remaining in the gas delivery lines after a deposition. This may be accomplished using one or more three-way valves (not shown), to isolate process chamber 110 from one or more gas delivery lines 119, and to vent the one or more gas delivery lines 119 to a vacuum foreline (not shown), for example. Such three-way valves may be placed as close to process chamber 110 as practical, to minimize the volume of the unvented gas delivery line (between the three-way valve and the process chamber). Additionally, two-way (on-off) valves (not shown) may be placed between a mass flow controller (MFC) and the process chamber or between a gas source and an MFC.

The plasma-based substrate processing system 100 may further include a remote cleaning RF plasma source (not shown) for providing a cleaning gas to the top nozzle 150 of the chamber 110. In other embodiments, cleaning gas (if used) may enter the chamber 110 at other locations.

A system controller 160 regulates the operation of the plasma-based substrate processing system 100 and includes a processor 162 and a memory 164. Typically, the processor 162 is part of a single-board computer (SBC), that includes analog and digital input/output boards, interface boards and stepper motor controller boards. Various components of the plasma-based substrate processing system 100 conform to the Versa Modular European (VME) standard, which defines board, card cage, as well as connector type and dimensions. The VME standard also defines the bus structure as having a 16-bit data bus and a 24-bit address bus. The processor 162 executes system control software, which may be a computer program stored in the memory 164. Any type of memory device may be employed, such as a hard disk drive, a floppy disk drive, a card rack or a combination thereof. The system control software includes sets of instructions that dictate the timing, mixture of gases, process chamber pressure, process chamber temperature, microwave power levels, pedestal position, and other parameters of a particular process.

In operation, the substrate 106 is placed on the electrostatic chuck 108 of the substrate support 102 and multiple gaseous components are supplied from gas delivery system 118 into the processing region 120 of the plasma processing chamber 110 to form a gaseous mixture. To ignite a plasma, RF power is applied to one or more of an electrode in the substrate support 102, the top coil 138, or side coil 140. During processing of the substrate using the plasma, a reduced quantity of contaminants may be deposited on the surface of the process kit 104 as compared to convention process kits.

For example, in one particular process, such as CVD deposition of silicon oxide, particularly in an HDP-CVD process, the deposition of the silicon oxide is accompanied by sputtering of a portion of the deposited film. This sputtering effect causes deposits on the process kit that build up over time (such as aluminum fluoride deposits). However, the process kits in accordance with the present invention advantageously provide for increased distances between the substrate surface and the upper surface of the process kit, thereby minimizing the deposition of materials sputtered from the substrate and increasing the amount of buildup that can occur prior to any contaminants migrating to the substrate, thereby reducing the likelihood of contamination of the substrate and increasing the mean time between cleaning required for the process kit. Moreover, the process kits in accordance with the present invention may facilitate faster heating times and may reach a higher temperature during cleaning processes as compared to conventional process kits having a greater mass, thereby facilitating more rapid and more complete removal of any contaminants built up on the process kit, thereby reducing the cleaning time required.

Thus, embodiments of process kits for a substrate support are provided herein. The process kits may advantageously facilitate reduced deposition of contaminants thereon, and may reduce down time during chamber cleaning processes to remove the deposited contaminants from the process kit.

While the foregoing is directed to embodiments of the present invention, other and further embodiments of the invention may be devised without departing from the basic scope thereof, and the scope thereof is determined by the claims that follow.

What is claimed is:

1. A process kit to cover a surface of a substrate support pedestal not covered by a substrate when the substrate is disposed on a support surface of the substrate support pedestal in a semiconductor process chamber, the process kit comprising:

an annular body having an inner and an outer edge, and having an upper and lower surface, the upper surface disposed at a downward angle of between about 5-65 degrees in a radially outward direction from the inner edge toward the outer edge;

an inner lip disposed proximate the inner edge and having a horizontal surface extending from the upper surface of the annular body, wherein the inner edge has a vertical distance measured between the lower surface of the annular body and the horizontal surface of the inner lip such that the horizontal surface of the inner lip is lower than the support surface when the process kit is disposed on the substrate support pedestal; and an outer lip disposed proximate the outer edge and extending downward from the lower surface, the outer lip having a shape conforming to a surface of substrate support pedestal having the outer lip disposed thereon, wherein a first portion of a lower surface of the outer lip is disposed at a downward angle in a radially outward direction from the inner edge toward the outer edge, wherein a second portion of the lower surface of the outer lip is disposed in a radially outward direction from the first portion of the lower surface of the outer lip, and wherein the second portion of the lower surface of the outer lip does not contact the substrate support pedestal when the process kit is disposed on the substrate support pedestal.

2. The process kit of claim 1, wherein the thickness of the annular body proximate the inner edge is about 0.206 inches.

3. The process kit of claim 1, wherein the annular body, the inner lip, and the outer lip comprise one of high purity aluminum oxide (99.99 percent purity), aluminum oxide (99.95 percent purity), or aluminum nitride.

4. The process kit of claim 1, wherein an inner diameter of the annular body as measured to the inner edge is between about 11 to 13 inches.

5. The process kit of claim 1, wherein a diameter of the annular body as measured to the inner edge is about 11.736 inches.

6. The process kit of claim 1, wherein a width of the inner lip is about 0.032 inches.

7. The process kit of claim 1, wherein the vertical distance measured between the lower surface of the annular body and the horizontal surface of the inner lip is about 0.206 inches.

8. The process kit of claim 1, wherein guide pins having a diamond-shaped cross section are disposed on the upper surface of the annular body and periodically about a circumference of the annular body proximate the inner edge.

9. The process kit of claim 1, wherein an outer edge of the outer lip includes an overhang lip extending downward from a lower surface of the outer lip, and overhangs an outer edge of the substrate support pedestal when the process kit is disposed on the substrate support pedestal.

10. The process kit of claim 1, wherein the process kit is fabricated from one-piece construction.

11. An apparatus for processing a substrate, comprising:

a semiconductor process chamber having a substrate support pedestal disposed therein, the substrate support pedestal having a support surface to support a substrate thereon; and a process kit disposed on a surface of the substrate support pedestal, the process kit comprising: an annular body having an inner and an outer edge, and having an upper and lower surface, the upper surface disposed at a downward angle of between about 5-65 degrees in a radially outward direction from the inner edge toward the outer edge;

an inner lip disposed proximate the inner edge and having a horizontal surface extending from the upper surface of the annular body, wherein the horizontal surface of the inner lip is lower than the support surface of the substrate support pedestal; and an outer lip disposed proximate the outer edge and extending downward from the lower surface, the outer lip having a shape conforming to a surface of substrate support pedestal having the outer lip disposed thereon, wherein a first portion of a lower surface of the outer lip is disposed at a downward angle in a radially outward direction from the inner edge toward the outer edge, wherein a second portion of the lower surface of the outer lip is disposed in a radially outward direction from the first portion of the lower surface of the outer lip, and wherein the second portion of the lower surface of the outer lip does not contact the substrate support pedestal.

12. The apparatus of claim 11, wherein the annular body, the inner lip, and the outer lip comprise one of high purity aluminum oxide (99.99 percent purity), aluminum oxide (99.95 percent purity), or aluminum nitride.

13. The apparatus of claim 11, wherein an inner diameter of the annular body as measured to the inner edge is between about 11 to 13 inches.

14. The apparatus of claim 11, wherein a vertical distance measured between the lower surface of the annular body and the horizontal surface of the inner lip is about 0.206 inches.

15. The apparatus of claim 11, further comprising:

a plurality of guide pins having a diamond-shaped cross section disposed on the upper surface of the annular body proximate the inner edge.

16. The apparatus of claim 11, wherein an outer edge of the outer lip includes an overhang lip extending downward from a lower surface of the outer lip and overhangs an outer edge of the substrate support pedestal.

17. The apparatus of claim 11, wherein the process kit is fabricated from one-piece construction.

18. A process kit to cover a surface of a substrate support pedestal not covered by a substrate when the substrate is disposed on a support surface of the substrate support pedestal in a semiconductor process chamber, the process kit comprising:

an annular body having an inner and an outer edge, and having an upper and lower surface, the upper surface disposed at a downward angle of between about 5-65 degrees in a radially outward direction from the inner edge toward the outer edge, wherein at least a portion of the lower surface may be spaced apart from the upper surface of the substrate support pedestal when the process kit is disposed on the substrate support pedestal;

an inner lip disposed proximate the inner edge and having a horizontal surface extending from the upper surface of the annular body, wherein the inner edge has a vertical distance measured between the lower surface of the annular body and the horizontal surface of the inner lip such that the horizontal surface of the inner lip is lower than the support surface when the process kit is disposed on the substrate support pedestal; and an outer lip disposed proximate the outer edge and extending downward from the lower surface, the outer lip having a shape conforming to a surface of substrate support pedestal having the outer lip disposed thereon, wherein a first portion of a lower surface of the outer lip is disposed at a downward angle in a radially outward direction from the inner edge toward the outer edge, wherein a second portion of the lower surface of the outer lip is disposed in a radially outward direction from the first portion of the lower surface of the outer lip.

19. The process kit of claim 18, wherein the at least a portion of the lower surface that is spaced apart from the substrate support pedestal when the process kit is disposed on the substrate support pedestal is spaced apart from the substrate support pedestal by about 0.030 inches.

20. The process kit of claim 18, wherein the process kit is fabricated from one-piece construction.

21. A process kit to cover a surface of a substrate support pedestal not covered by a substrate when the substrate is disposed on a support surface of the substrate support pedestal in a semiconductor process chamber, the process kit comprising:

an annular body having an inner and an outer edge, and having an upper and lower surface, the upper surface disposed at a downward angle of between about 5-65 degrees in a radially outward direction from the inner edge toward the outer edge, wherein at least a portion of the lower surface may be spaced apart from the upper surface of the substrate support pedestal when the process kit is disposed on the substrate support pedestal;

an inner lip disposed proximate the inner edge and having a horizontal surface extending from the upper surface of the annular body, wherein the inner edge has a vertical distance measured between the lower surface of the annular body and the horizontal surface of the inner lip such that the horizontal surface of the inner lip is lower than the support surface when the process kit is disposed on the substrate support pedestal;

an outer lip disposed proximate the outer edge and extending downward from the lower surface, the outer lip having a shape conforming to a surface of substrate support pedestal having the outer lip disposed thereon, wherein an outer edge of the outer lip includes an overhang lip extending downward from a lower surface of the outer lip and overhangs an outer edge of the substrate support pedestal when the process kit is disposed on the substrate support pedestal;

wherein a first portion of a lower surface of the outer lip is disposed at a downward angle in a radially outward direction from the inner edge toward the outer edge, wherein a second portion of the lower surface of the outer lip is disposed in a radially outward direction from the first portion of the lower surface of the outer lip; and a plurality of substrate guide pins disposed proximate the inner lip and extending upward from the upper surface of the annular body.

22. The process kit of claim 21, wherein the plurality of substrate guide pins consists of 4 substrate guide pins.

23. The process kit of claim 21, wherein the process kit is fabricated from one-piece construction.

* * * * *